(12) United States Patent
Choi et al.

(10) Patent No.: US 8,614,462 B2
(45) Date of Patent: Dec. 24, 2013

(54) ARRAY SUBSTRATE FOR ORGANIC ELECTROLUMINESCENT DEVICE AND METHOD OF FABRICATING THE SAME

(75) Inventors: Hee-Dong Choi, Gumi-si (KR); Ki-Sul Cho, Gumi-Si (KR); Seong-Moh Seo, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 53 days.

(21) Appl. No.: 13/285,584

(22) Filed: Oct. 31, 2011

(65) Prior Publication Data
US 2012/0104405 A1    May 3, 2012

(30) Foreign Application Priority Data

Nov. 2, 2010   (KR) .................. 10-2010-0107956

(51) Int. Cl.
*H01L 27/118* (2006.01)
(52) U.S. Cl.
USPC ........... 257/204; 438/155; 438/151; 349/140; 257/203; 257/210; 257/350; 257/E21.507

(58) Field of Classification Search
USPC ............ 257/98, E31.096, E31.129, E31.095, 257/203, 210, 350, E21.507, 204; 438/29, 438/155, 151; 349/140
See application file for complete search history.

*Primary Examiner* — Amar Movva
(74) *Attorney, Agent, or Firm* — Brinks Hofer Gilson & Lione

(57) ABSTRACT

A method of fabricating an array substrate for an organic electroluminescent device includes forming a semiconductor layer of polysilicon in an element region, and a semiconductor pattern of polysilicon in a storage region on a substrate; forming a multiple-layered gate electrode corresponding to a center portion of the semiconductor layer and a first storage electrode corresponding to the semiconductor pattern; performing an impurity-doping to make a portion of the semiconductor layer not covered by the gate electrode into an ohmic contact layer and make the semiconductor pattern into a second storage electrode; forming source and drain electrodes and a third storage electrode corresponding to the first storage electrode; forming a first electrode contacting the drain electrode and a fourth storage electrode corresponding to the third storage electrode.

17 Claims, 9 Drawing Sheets

FIG. 1A
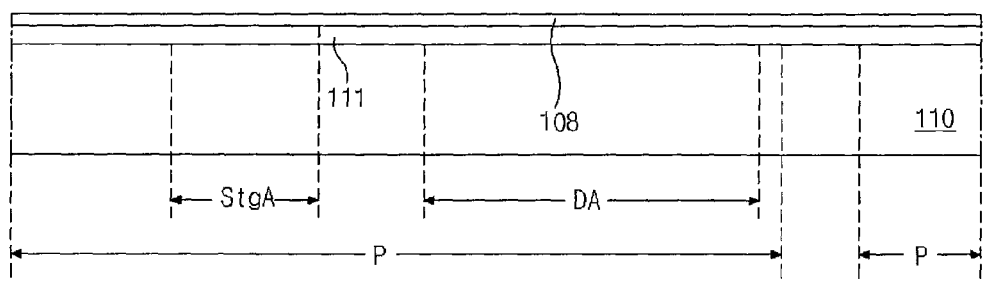
FIG. 1B
crystallization
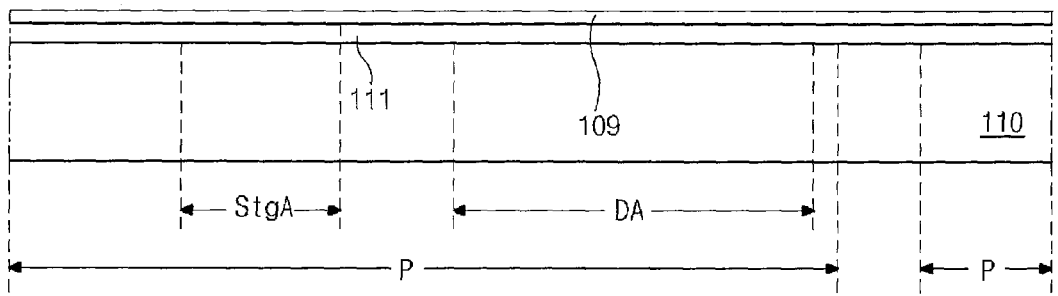

ashing impurity-doping

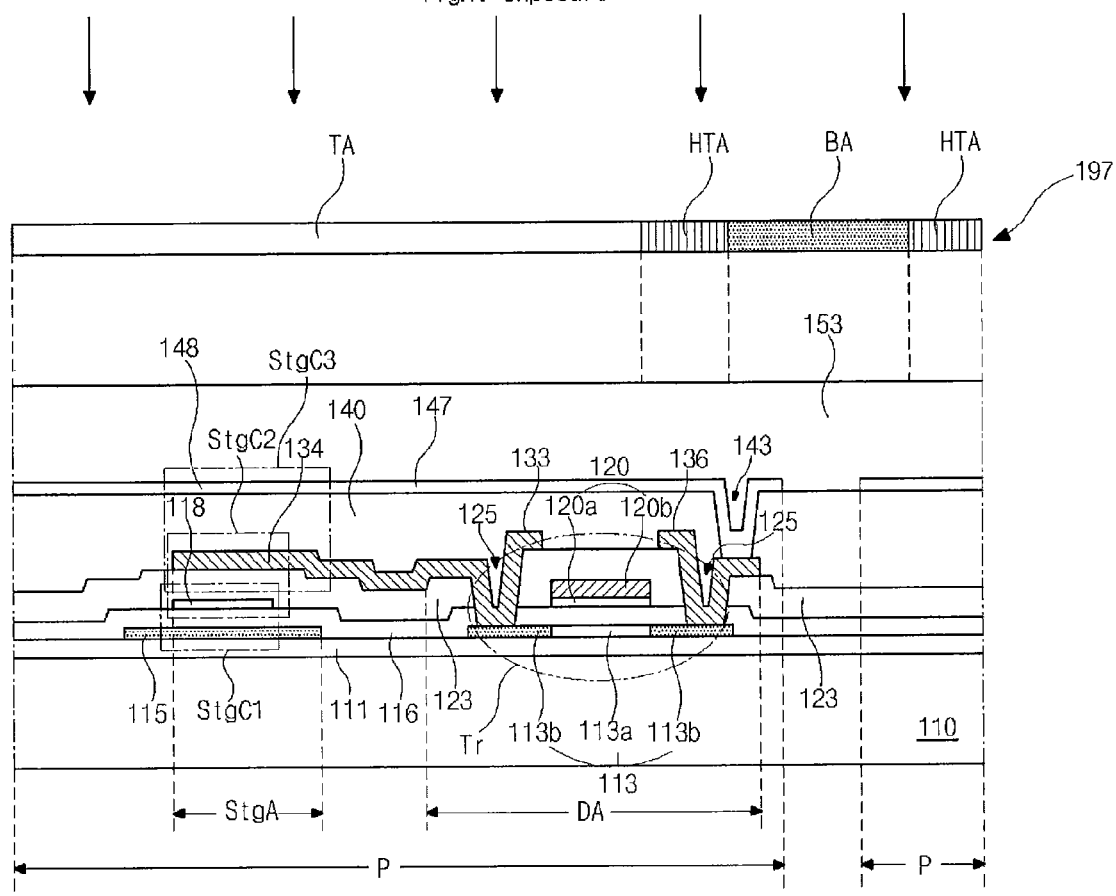

ARRAY SUBSTRATE FOR ORGANIC ELECTROLUMINESCENT DEVICE AND METHOD OF FABRICATING THE SAME

This application claims the benefit of Korea Patent Application No. 10-2010-0107956, filed on Nov. 2, 2010, the entire contents of which is incorporated herein by reference for all purposes as if fully set forth herein.

BACKGROUND

1. Field of the Invention

The present disclosure relates to an array substrate for an organic electroluminescent device, and more particularly, to an array substrate for an organic electroluminescent device and a method of fabricating the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and organic electroluminescent device (OELDs), as a substitute for CRTs. Of these flat panel displays, OELDs have many advantages, such as high contrast ratio, low power supply, thin profile, wide viewing angle, light weight, stability at a low temperature, simple fabrication, and easy design and fabrication of driving circuit.

The OELD includes an array substrate including thin film transistors that control operations of turning on/off pixel regions.

The thin film transistor of the array substrate includes a semiconductor layer made of polysilicon that has property of high mobility.

The array substrate including the polysilicon thin film transistor is fabricated with about 9 or 10 mask processes.

In other words, 9 mask processes are performed for the array substrate before forming an organic light emitting layer. The 9 mask processes typically comprise: forming a semiconductor layer; forming a first storage electrode; forming a gate electrode; forming an inter-layered insulating film including a semiconductor contact hole; forming source and drain electrodes; forming first and second passivation layers; forming an anode; forming a bank; and forming a spacer.

The mask process is a photolithography process that includes many steps: forming a material layer, on a substrate, that is patterned later, forming a photoresist layer thereon, light-exposing the photoresist layer using a mask including a transmissive portion and a blocking portion, developing the light-exposed photoresist layer to form a photoresist pattern, etching the material layer using the photoresist pattern, stripping the photoresist pattern and the like.

Accordingly, one mask process needs apparatuses and materials for the above respective steps and multiplied by the respective steps.

Accordingly, efforts are made to reduce the mask processes for the array substrate in order to reduce production costs and improve production efficiency.

In addition, the array substrate is designed to include a storage capacitor having a large capacity for image display stability. An overlap configuration is employed to increase the storage capacity per unit area.

However, an area of a pixel region decreases according to a recent trend in display art toward high resolution. Accordingly, even though a storage capacitor is realized through double overlaps, a storage capacity is insufficient for stable image display.

Increase of an area of a storage capacitor to secure a storage capacity causes reduction of an aperture ratio.

BRIEF SUMMARY

A method of fabricating an array substrate for an organic electroluminescent device includes forming a semiconductor layer of polysilicon in an element region, where a thin film transistor is formed, and a semiconductor pattern of polysilicon in a storage region on a substrate, wherein the element region and the storage region are in a pixel region defined by a gate line and a data line crossing each other; forming a gate insulating layer on the semiconductor layer and the semiconductor pattern; forming a multiple-layered gate electrode corresponding to a center portion of the semiconductor layer and a first storage electrode corresponding to the semiconductor pattern on the gate insulating layer; performing an impurity-doping to make a portion of the semiconductor layer not covered by the gate electrode into an ohmic contact layer and make the semiconductor pattern into a second storage electrode; forming an inter-layered insulating film that is on the gate electrode and the first storage electrode and exposes the ohmic contact layer; forming source and drain electrodes spaced apart from each other and each contacting the ohmic contact layer and a third storage electrode corresponding to the first storage electrode on the inter-layered insulating film; forming a passivation layer that is on the source and drain electrodes and the third storage electrode and exposes the drain electrode; forming a first electrode contacting the drain electrode and a fourth storage electrode corresponding to the third storage electrode on the passivation layer; and forming a bank along a boundary of the pixel region and a spacer selectively along the boundary of the pixel region, wherein the spacer has a height more than that of the bank.

In another aspect, an array substrate for an organic electroluminescent device includes a semiconductor layer of polysilicon in a element region, where a thin film transistor is formed, and a first storage electrode of polysilicon doped with impurities in a storage region on a substrate, wherein the element region and the storage region are in a pixel region defined by a gate line and a data line crossing each other; a gate insulating layer on the semiconductor layer and the first storage electrode; a multiple-layered gate electrode corresponding to a center portion of the semiconductor layer and a second storage electrode corresponding to the first storage electrode on the gate insulating layer; an inter-layered insulating film that covers the gate electrode and the second storage electrode and exposes both sides of the semiconductor layer; source and drain electrodes contacting the both sides of the semiconductor layer, respectively, and spaced apart from each other, and a third storage electrode corresponding to the second storage electrode on the inter-layered insulating film; a passivation layer covering the source and drain electrodes and the third storage electrode and exposing the drain electrode; a first electrode in each pixel region and contacting the drain electrode, and a fourth storage electrode corresponding to the third storage electrode on the passivation layer; and a bank overlapping a peripheral portion of the first electrode and along a boundary of the pixel region, and a spacer made of the same material as the bank, on the passivation layer, and selectively formed along the boundary of the pixel region, wherein the spacer has a height more than that of the bank.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Figure 1C:
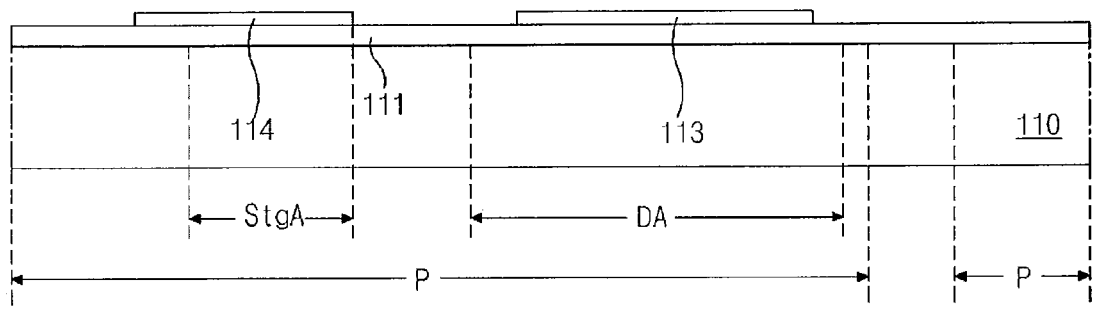
FIGS. 1A to 1O are cross-sectional views illustrating a method of fabricating an array substrate of an OELD according to an embodiment of the present invention.

Reference will now be made in detail to illustrated embodiments of the present invention, which are illustrated in the accompanying drawings.

FIGS. 1A to 1O are cross-sectional views illustrating a method of fabricating an array substrate for an OELD according to an embodiment of the present invention. For the purposes of explanation, a region where a thin film transistor is formed in each pixel region is defined as an element region DA, and a region where a storage capacitor is formed is defined as a storage region StgA. Further, the thin film transistor in the element region DA is a driving thin film transistor connected to an organic light emitting diode, and a switching thin film transistor connected to a gate line and a data line has the same structure and thus is not shown. Further, in the following explanations, the switching thin film transistor and the driving thin film transistor are not distinguished and are referred to as a thin film transistor.

Referring to FIG. 1A, an inorganic insulating material, such as silicon nitride (SiNx) or silicon oxide (SiO2), is deposited on a substrate 110 to form a buffer layer 111. When an amorphous silicon layer 108 is crystallized into a polysilicon layer (109 of FIG. 1B), alkali ions, such as potassium ions (K+), sodium ions (Na+) and the like, which exist in the substrate 110, are emitted from the substrate 110 due to laser irradiation or thermal treatment for the crystallization. The alkali ions may degrade property of the polysilicon layer 109. To prevent this, the buffer layer 111 is formed before forming the polysilicon layer 109. However, the buffer layer 111 may not be needed according to material of the substrate 111.

The amorphous silicon layer 108 is formed on the buffer layer 111.

Referring to FIG. 1B, to improve mobility of the intrinsic amorphous silicon layer 108, the crystallization is performed to form the intrinsic polysilicon layer 109. The crystallization may be a solid phase crystallization (SPC) or a laser-using crystallization.

The SPC may be a thermal crystallization that performs a thermal treatment in a condition of about 600 degrees Celsius to about 800 degrees Celsius, or a alternating magnetic field crystallization that uses a alternating magnetic field crystallization apparatus in a condition of about 600 degrees Celsius to about 700 degrees Celsius. The laser-using crystallization may be a excimer laser annealing (ELA) crystallization, or a sequential lateral solidification (SLS) crystallization.

Referring to FIG. 1C, a patterning is performed through a mask process for the polysilicon layer 109 that includes depositing a photoresist layer on the polysilicon layer 109, light-exposing the photoresist layer, developing the light-exposed photoresist layer to form a photoresist pattern, etching the polysilicon layer 109 using the photoresist pattern, and stripping the photoresist pattern. Accordingly, a semiconductor layer 113 of the polysilicon is formed in the element region DA, and a semiconductor pattern 114 of the polysilicon is formed in the storage region StgA. The storage pattern 114 will become a first storage electrode through doping it with impurities.

Figure 1D:
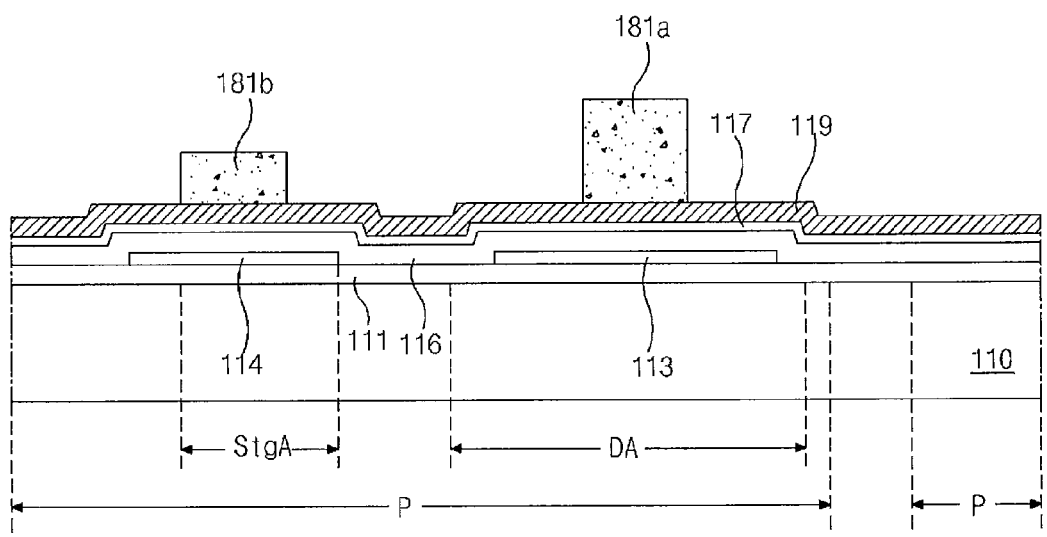

Referring to FIG. 1D, an inorganic insulating material, such as silicon nitride (SiNx) or silicon oxide (SiO2) is deposited on the substrate 111 having the semiconductor layer 113 and the semiconductor pattern 114 to form a gate insulating layer 116.

Then, a transparent conductive material, such as indium-tin-oxide (ITO) or indium-zinc-oxide (IZO), or indium-tin-zinc-oxide (ITZO), is deposited on the gate insulating layer 116 to form a transparent conductive layer 117 that has a thickness of about 100 Å to about 500 Å. Then, a gate metal layer 119 is formed on the transparent conductive layer 117. The gate metal layer may be a single or multiple-layered structure using one or more of low resistance metal materials, for example, aluminum (Al), aluminum alloy (e.g., AlNd), copper (Cu), copper alloy, molybdenum (Mo), and molytitanium (MoTi). In the drawings, a single-layered gate metal layer 119 is shown.

Then, a photoresist layer is formed on the gate metal layer 119 and light-exposed using a photo mask that includes a transmissive portion, a blocking portion, and a semi-transmissive portion. The semi-transmissive portion may use a slit for light diffraction, or a multi coating films such that a transmittance thereof is less than that of the transmissive portion and more than of the blocking portion.

The light-exposed photoresist layer is developed to form a first photoresist pattern 181a corresponding to the transmissive portion and a second photoresist pattern 181b corresponding to the semi-transmissive portion. The first photoresist pattern 181a has a first thickness more than a second thickness of the second photoresist pattern 181b. The photoresist layer corresponding to the blocking portion is removed to expose the gate metal layer 109 therebelow.

The second photoresist pattern 181b is formed corresponding to the storage area (StgA), and the first photoresist pattern 181a is formed corresponding to a center portion of the semiconductor layer 113 of the element region DA.

Figure 1E:
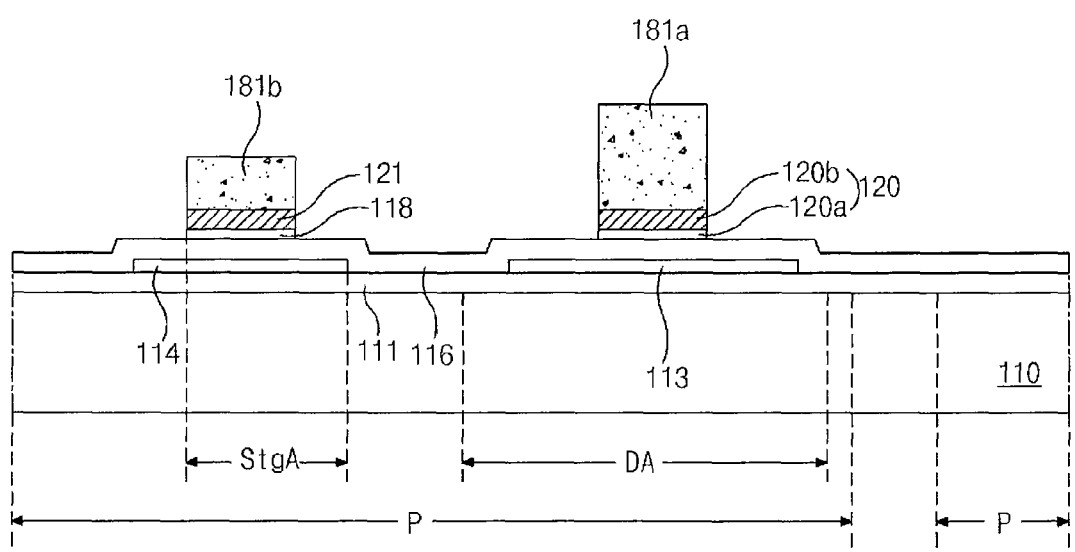

Referring to FIG. 1E, the gate metal layer 119 and the transparent conductive layer 117 are sequentially etched using the first and second photoresist patterns 181a and 181b. Accordingly, a gate electrode 120 of a multi-layered structure, which includes a lower layer 120a of the transparent conductive material and an upper layer 120b of the low resistance metal, is formed corresponding to the center portion of the semiconductor layer 113 of the element region DA, and a second storage electrode 118 of the transparent conductive material and a dummy metal pattern 121 is formed corresponding to the storage region StgA.

Although not shown in the drawings, a gate line of a multi-layered structure is formed on the gate insulating layer 116 along a boundary of the pixel region P. The gate line is connected to a gate electrode of a switching thin film transistor.

Figure 1F:
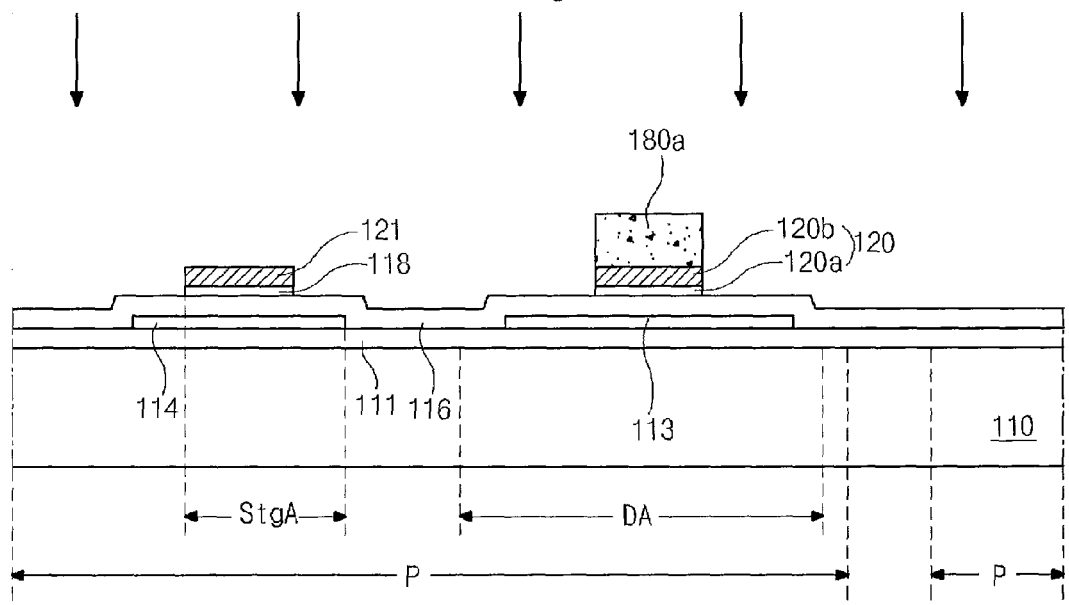

Referring to FIG. 1F, an ashing process is performed to remove the second photoresist pattern 181b having the second thickness and expose the dummy metal pattern 121 therebelow.

The first photoresist pattern 181a is reduced in thickness but remains on the gate electrode 120 and the gate line.

Figure 1G:
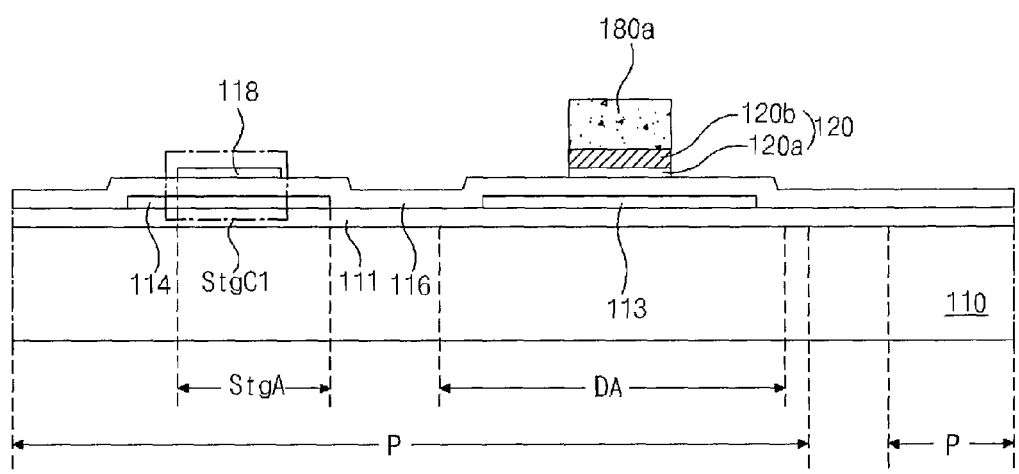

Then, referring to FIG. 1G, the dummy metal pattern 121 is removed and the second storage electrode 118 is thus exposed.

Figure 1H:
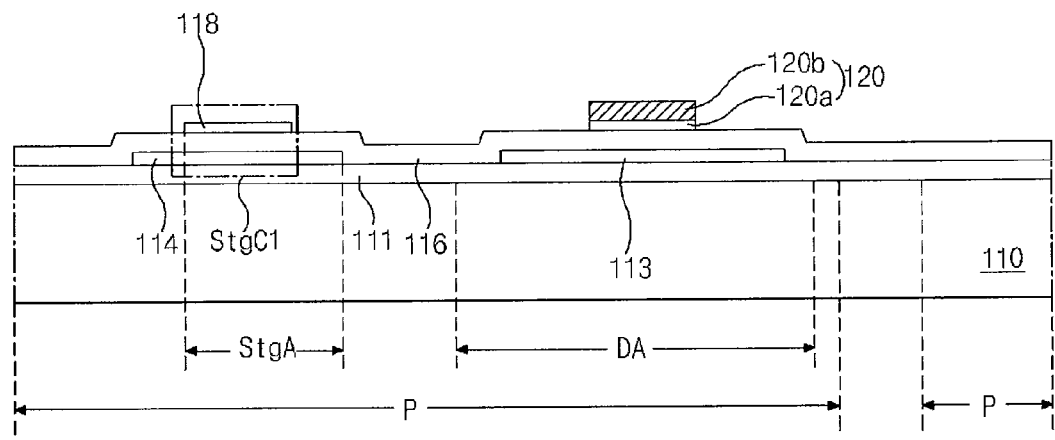

Referring to FIG. 1H, a stripping process is performed to remove the first photoresist pattern 181a and thus expose the gate electrode 120 and the gate line.

Figure 1I:
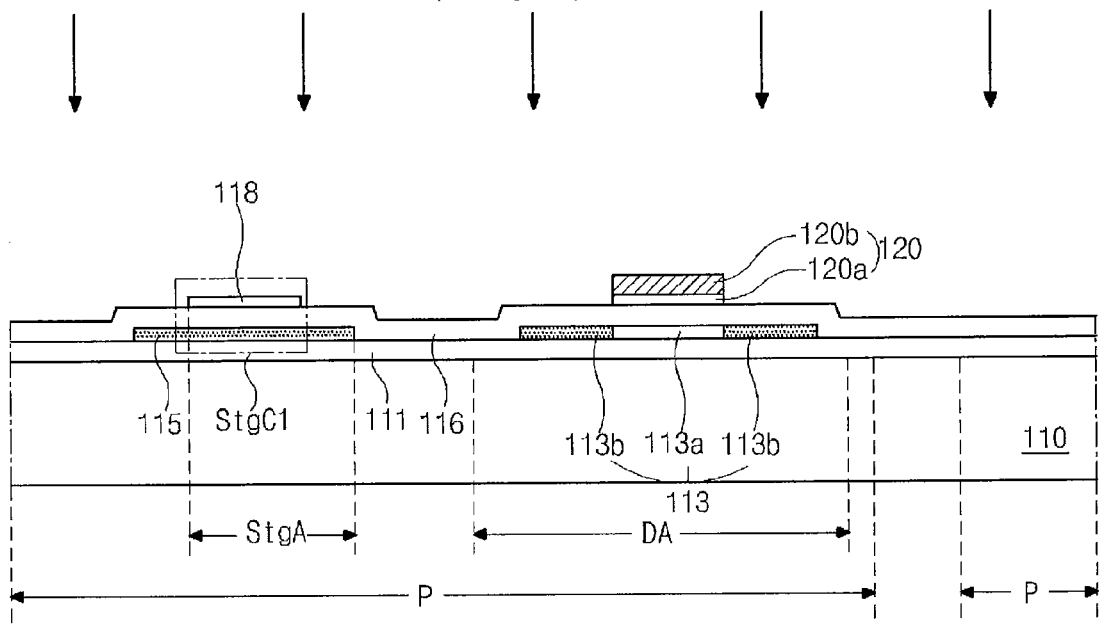

Referring to FIG. 1I, in the state that the gate electrode 120 and the gate line are exposed, a doping process is performed with p type impurities, for example, boron (B), indium (In), or gallium (Ga), or n type impurities, for example, phosphorus (P), arsenic (As), or antimony (Sb).

Through the doping, the semiconductor pattern 114 is doped with the impurities and improved in mobility property. Accordingly, the semiconductor pattern 114 can function as an electrode and thus become a first storage electrode 115.

The second storage electrode 118 of the transparent conductive material is formed in the storage region StgA. However, since the second storage electrode 118 has the thickness of about 100Å to about 500Å, the impurities ions can pass through the second storage electrode 118 and reach inside the semiconductor pattern 114 by adjusting an energy density in the doping. Accordingly, the second storage electrode 118 is not problematic with the impurities doping.

Further, regarding the element region DA, during the doping, a portion of the semiconductor layer 113 not covered by the gate electrode 120 is doped with the impurities while the center portion of the semiconductor layer 113 is blocked by the gate electrode 120 thereover and remains as the intrinsic polysilicon.

Accordingly, after the doping is finished, the semiconductor layer 113 includes an ohmic contact layer 113b located at each of both sides of the center portion and doped with the impurities, and an active layer 113a not doped and of the intrinsic polysilicon.

The first storage electrode 115 and the second storage electrode 118 form a first storage capacitor StgC1 along with the gate insulating layer 116 therebetween.

Figure 1J:
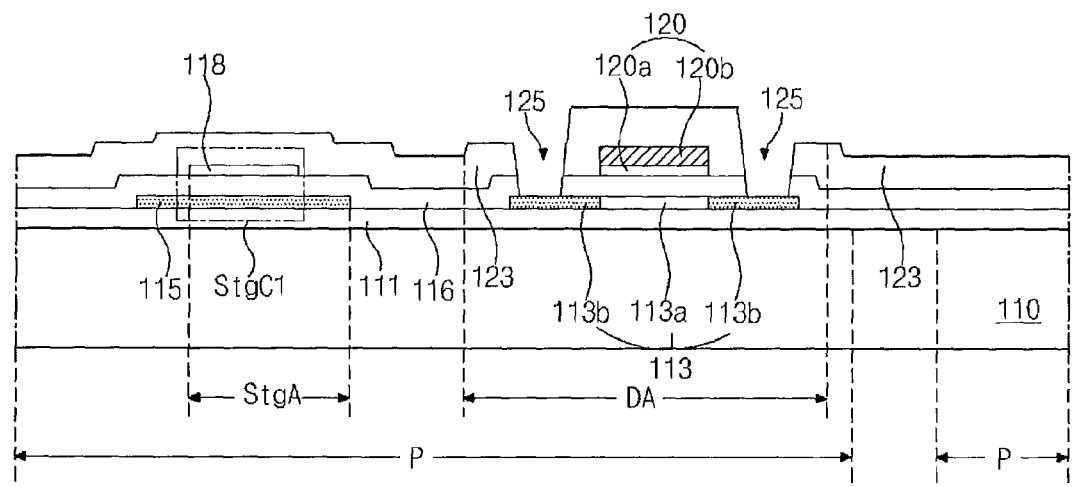

Referring to FIG. 1J, an inorganic insulating material, such as silicon nitride (SiNx) or silicon oxide (SiO2), or an organic insulating material, such as benzocyclobutene (BCB) or photo acrylic is deposited on the substrate 111 having the gate electrode 120, the gate line and the second storage electrode 118 to form an inter-layered insulating film 123.

A mask process is performed for the inter-layered insulating film 123 and the gate insulating layer 116 to form a semiconductor hole 125 that exposes the ohmic contact layer 113b.

Figure 1K:
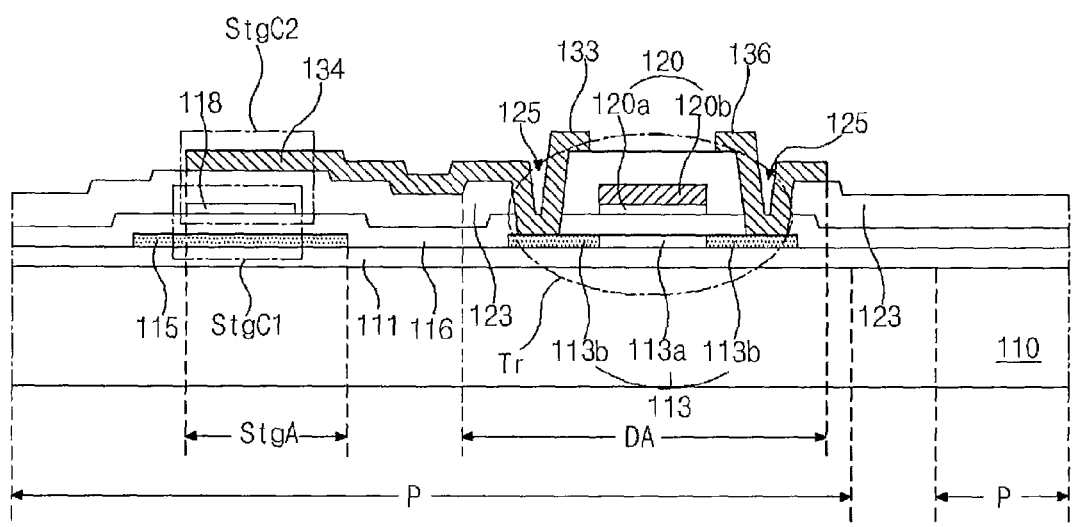

Referring to FIG. 1K, a second metal layer is formed on the inter-layered insulating film 123. The second metal layer may be formed by depositing at least one of aluminum (Al), aluminum alloy (e.g., AlNd), copper (Cu), copper alloy, molybdenum (Mo) and molytitanium (MoTi).

Then, a mask process is performed for the second metal layer to form a data line (not shown) that is at a boundary of the pixel region P and crosses the gate line to define the pixel region P, and a power line spaced apart from and in parallel with the data line.

Further, through the mask process, source and drain electrodes 133 and 135 are formed and each contacts the ohmic contact layer 113b through the corresponding semiconductor contact hole 125. In particular, the drain electrode 136 extends over the storage region StgA so that the extended portion thereof functions as a third storage electrode 134.

Through the above configuration, the second storage electrode 118 and the third storage electrode 134 form a second storage capacitor StgC2 along with the inter-layered insulating film 123 therebetween in the storage region StgA, and the first and second storage capacitors StgC1 and StgC2 are connected in parallel with each other by means of the second storage electrode 118, and a total storage capacity can increase.

Figure 1L:
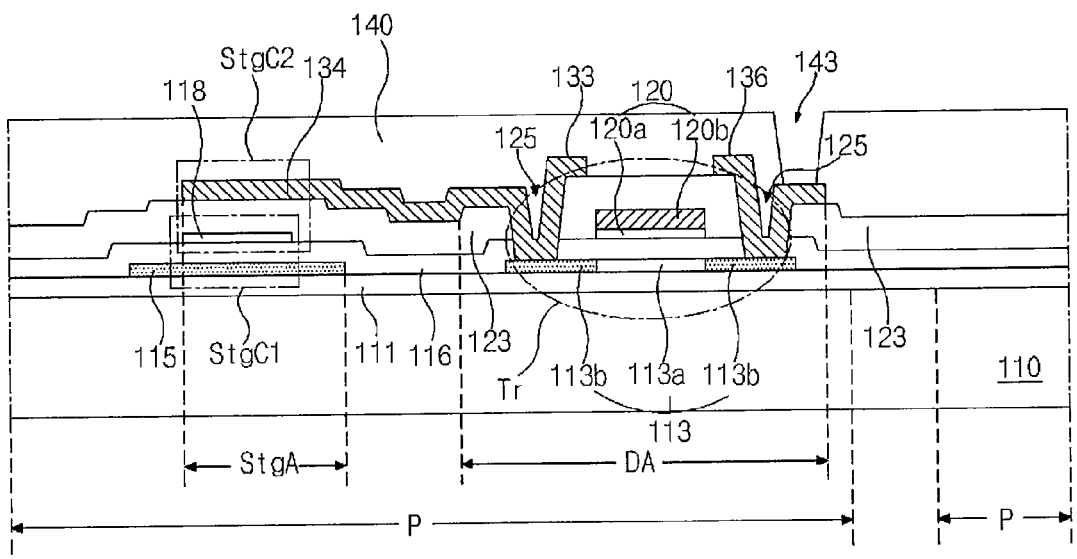

Referring to FIG. 1L, an organic insulating material, such as benzocyclobutene (BCB) or photo acrylic, is deposited on the substrate 111 having the source and drain electrodes 133 and 136 to form a passivation layer 140 that makes a surface of the substrate 111 having the source and drain electrodes 133 and 136 substantially even. A mask process is performed for the passivation layer 140 to form a drain contact hole 143 that exposes the drain electrode 136 of the thin film transistor Tr.

The drain contact hole 143 is substantially for contacting the drain electrode 136 of the driving thin film transistor with a first electrode (147 of FIG. 1O) of an organic light emitting diode that is formed on the passivation layer 140.

Figure 1M:
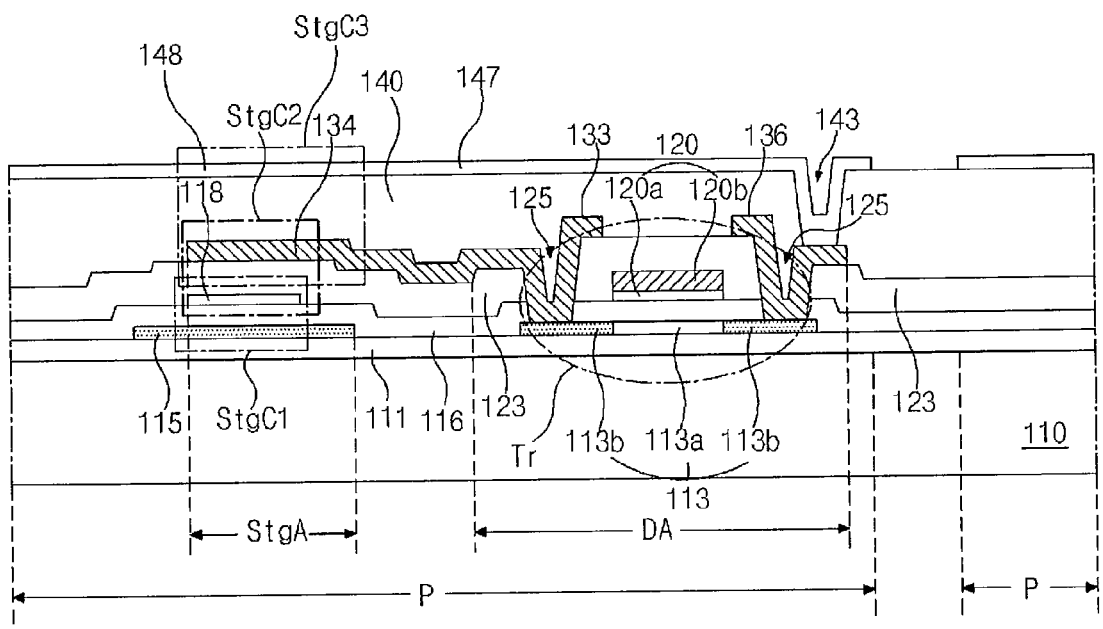
Figure 10:
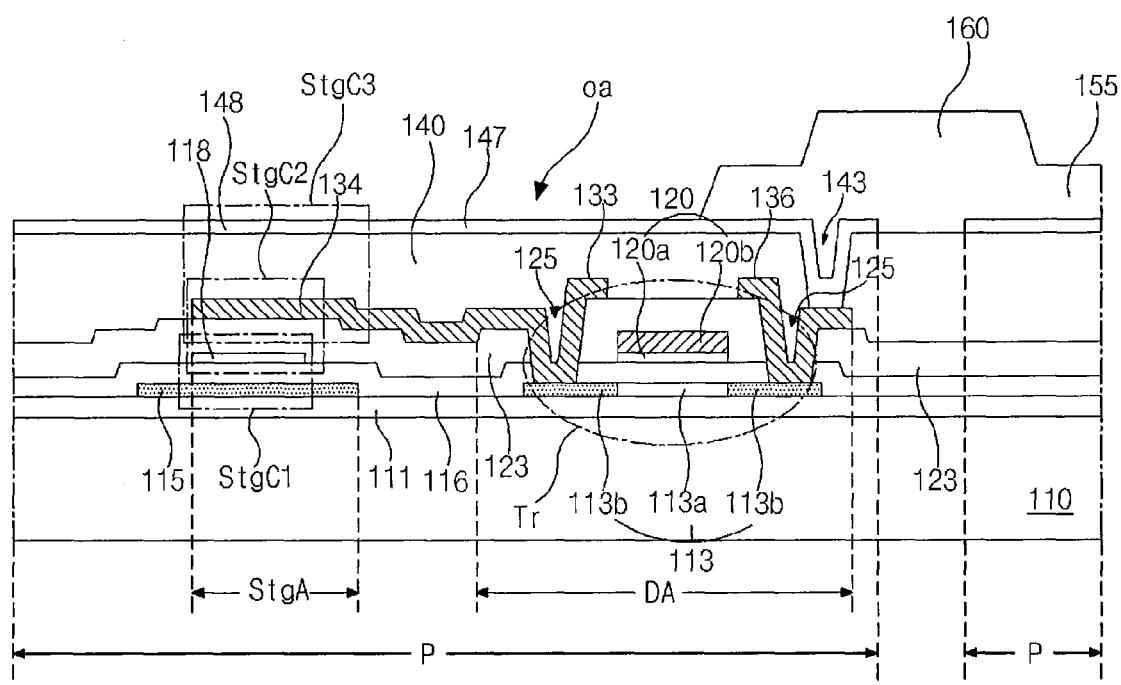

Referring to FIG. 1M, a transparent conductive material, such as indium-tin-oxide (ITO), indium-zinc-oxide (IZO), or indium-tin-zinc-oxide (ITZO), is deposited on the passivation layer 140 and a mask process is performed for the transparent conductive material layer. Accordingly, a first electrode 147 that contacts the drain electrode 136 through the drain contact hole 143 is formed.

To increase light emission efficiency of the organic light emitting diode, a metal having a high reflection property, for example, aluminum (Al), aluminum alloy (e.g., AlNd), or silver (Ag) is first deposited on the passivation layer 140 and the transparent conductive material is then deposited on the metal layer, and the first electrode 147 has thus a double-layered structure that includes a lower layer of the high reflective metal and an upper layer of the transparent conductive material. When the first electrode is formed to include the high reflective layer, the array substrate 110 becomes an array substrate for a top emission type OELD.

The first electrode 147 extends over the storage region StgA, and the extended portion of the first electrode 147 functions as a fourth storage electrode 148.

The fourth storage electrode 148 and the third storage electrode 134 form a third storage capacitor StgC3 along with the passivation layer therebetween, and the third storage capacitor StgC3 is connected in parallel with the second storage capacitor StgC3 by means of the third storage electrode 134. Accordingly, a total storage capacity can further increase.

In the embodiment, since the first to third storage capacitors connected in parallel are formed in the storage area StgA, there is an advantage of further increasing the storage capacity compared to the related art where two storage capacitors overlap.

Referring to FIG. 1N, an photosensitive organic insulating material, such as photo acrylic, benzocyclobutene (BCB) or polyimide, is deposited on the first electrode 147 to form an organic insulating layer 153.

A photo mask 197 including a transmissive portion TA, a blocking portion BA, and a semi-transmissive portion HTA is placed over the organic insulating layer 153, and a light-exposure is performed. The light-exposure may be referred to as a halftone light-exposure or light diffraction exposure because the semi-transmissive portion HTA is employed.

Referring to FIG. 1O, when the light-exposed organic insulating layer 153 is developed, a spacer 160 having a first height is formed at a portion of a boundary of the pixel region P corresponding to the transmissive portion TA of the photo mask 197, and a bank 155 is formed at the boundary of the pixel region P corresponding to the semi-transmissive portion HTA of the photo mask 197. The bank 155 has a thickness less than the first thickness of the spacer 160, and overlaps the first electrode 147.

A portion of the organic insulating layer 153 corresponding to the blocking portion BA of the photo mask 197 is removed in the developing process and the first electrode 147 therebelow is exposed.

As described above, 7 mask processes up to the process of forming the first electrode are performed. Accordingly, compared to the related art that performs 9 mask processes up to a process of forming a first electrode, 2 mask processes can be reduced. Therefore, production time and costs can be reduced.

Although not shown in the drawings, after forming the spacer 160 and the bank 155, an organic light emitting layer and a second electrode are sequentially formed. For example, the organic light emitting layer is formed on the first electrode 147 surrounded by the bank 155 by placing a shadow mask, which has an opening corresponding to the pixel region P, on the spacer 160 with the shadow mask contacting the spacer 160, and then performing a thermal deposition. Then, the second electrode is formed on the substrate 111 having the organic light emitting layer by depositing a metal having a low work function, for example, aluminum (Al), aluminum neodymium alloy (AlNd), aluminum magnesium alloy (AlMg), magnesium silver alloy (MgAg), or a silver (Ag). The first electrode 147, the organic light emitting diode and the second electrode form the organic light emitting diode.

Through the above processes, the array substrate 110 can be fabricated.

In addition, by placing an opposing substrate and the array substrate 110 facing each other, and forming a seal pattern along a peripheral portion of at least one of the array substrate 110 and the opposing substrate in an inert gas or vacuum condition and thus attaching the array substrate 110 and the opposing substrate, or interposing a face seal between the array substrate 110 and the opposing substrate and attaching the array substrate 110 and the opposing substrate, the OLED can be fabricated.

As described above, the array substrate includes three storage capacitors overlapping one another. Therefore, storage capacity per unit area can increase.

Further, 7 mask processes up to the process of forming the first electrode is performed. Therefore, compared to the related art, 2 mask processes can be reduced and production costs and time can thus be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method of fabricating an array substrate for an organic electroluminescent device, the method comprising:
    forming a semiconductor layer of polysilicon in an element region where a thin film transistor is formed, and forming a semiconductor pattern of polysilicon in a storage region on a substrate, wherein the element region and the storage region are in a pixel region defined by a gate line and a data line crossing each other;
    forming a gate insulating layer on the semiconductor layer and the semiconductor pattern;
    forming a multiple-layered gate electrode over a center portion of the semiconductor layer and forming a first storage electrode over the semiconductor pattern on the gate insulating layer;
    performing an impurity-doping to make a portion of the semiconductor layer not covered by the gate electrode into an ohmic contact layer and to make the semiconductor pattern into a second storage electrode;
    forming an inter-layered insulating film that is on the gate electrode and the first storage electrode and exposes the ohmic contact layer;
    forming source and drain electrodes spaced apart from each other and each contacting the ohmic contact layer and forming a third storage electrode over the first storage electrode on the inter-layered insulating film;
    forming a passivation layer that is on the source and drain electrodes and the third storage electrode and exposes the drain electrode;
    forming a first electrode contacting the drain electrode and forming a fourth storage electrode over the third storage electrode on the passivation layer; and
    forming a bank along a boundary of the pixel region and forming a spacer selectively along the boundary of the pixel region, wherein the spacer has a height more than the height of the bank.

2. The method according to claim 1, wherein forming the semiconductor layer and forming the semiconductor pattern includes:
    forming an amorphous silicon layer on the substrate;
    crystallizing the amorphous silicon layer into a polysilicon layer; and
    patterning the polysilicon layer.

3. The method according to claim 1, wherein forming the gate electrode and forming the first storage electrode includes:
    forming a transparent conductive material layer and a metal layer on the gate insulating layer;
    forming a first photoresist pattern having a first thickness in the storage region, and forming a second photoresist pattern having a second thickness in the element region on the metal layer, wherein the second thickness is more than the first thickness;
    removing the metal layer and the transparent conductive material layer using the first and second photoresist patterns and a dummy metal pattern sequentially laid in the storage region, and the gate electrode including a lower layer of the transparent conductive material and an upper layer of the metal in the element region;
    performing an ashing to remove the first photoresist pattern and expose the dummy metal pattern;
    removing the dummy metal pattern to expose the first storage electrode; and
    removing the second photoresist pattern.

4. The method according to claim 1, wherein the drain electrode and the third storage electrode are connected with each other.

5. The method according to claim 1, wherein the first electrode and the fourth storage electrode are connected with each other.

6. The method according to claim 1, wherein a surface of the passivation layer is substantially even.

7. The method according to claim 1, wherein forming the bank and the spacer includes:
    depositing a photosensitive organic insulating material on the first electrode to form an organic insulating layer;

light-exposing the organic insulating layer using a photo mask that includes a transmissive portion, a blocking portion and a semi-transmissive portion; and developing the light-exposed organic insulating layer to form the bank and the spacer.

8. The method according to claim 1, wherein forming the gate electrode includes forming the gate line along a direction on the gate insulating layer, and wherein forming the source and drain electrodes includes forming the data line crossing the gate line on the inter-layered insulating layer, and forming a power line spaced apart from and parallel with the data line.

9. The method according to claim 1, further comprising forming a buffer layer on the substrate before forming the semiconductor layer and the semiconductor pattern.

10. The method according to claim 1, wherein forming the first electrode includes:

depositing a metal having a high reflection efficiency on the passivation layer to form a lower metal layer; depositing a transparent conductive material on the lower metal layer to form an upper conductive layer; and continuously patterning the upper conductive layer and lower metal layer to form the first electrode having a double-layered structure, or forming and patterning a transparent conductive material layer on the passivation layer to form the first electrode having a single-layered structure.

11. An array substrate for an organic electroluminescent device, the substrate comprising:

a polysilicon semiconductor layer in a element region, where a thin film transistor is formed, and a first polysilicon storage electrode doped with impurities in a storage region on a substrate, wherein the element region and the storage region are in a pixel region defined by a gate line and a data line crossing each other;

a gate insulating layer on the semiconductor layer and the first storage electrode;

a multiple-layered gate electrode over a center portion of the semiconductor layer and a second storage electrode over the first storage electrode and the gate insulating layer;

an inter-layered insulating film that covers the gate electrode and the second storage electrode and exposes both sides of the semiconductor layer;

source and drain electrodes contacting the both sides of the semiconductor layer, and the source and drain electrodes spaced apart from each other, and a third storage electrode over the second storage electrode and the inter-layered insulating film;

a passivation layer covering the source and drain electrodes and the third storage electrode and exposing the drain electrode;

a first electrode in each pixel region and contacting the drain electrode, and a fourth storage electrode over the third storage electrode and the passivation layer; and a bank overlapping a peripheral portion of the first electrode and the bank extending along a boundary of the pixel region, and a spacer made of the same material as the bank on the passivation layer, the spacer selectively formed along the boundary of the pixel region, wherein the spacer has a height more than the height of the bank.

12. The substrate according to claim 11, wherein the drain electrode and the third storage electrode are formed in the same layer and of the same material, and connected with each other, and wherein the first electrode and the fourth storage electrode are formed in the same layer and of the same material, and connected with each other.

13. The substrate according to claim 11, wherein the second storage electrode has a thickness of about 100 Å to about 500 Å and is made of a transparent conductive material, and wherein a lower layer of the gate electrode is made of the same material as and has the same thickness as the second storage electrode, and an upper layer of the gate electrode is made of at least one metal.

14. The substrate according to claim 11, wherein the first storage electrode, the second storage electrode and the gate insulating layer between the first storage electrode and the second storage electrode form a first storage capacitor, wherein the second storage electrode, the third storage electrode and the inter-layered insulating film between the second storage electrode and the third storage electrode form a second storage capacitor, wherein the third storage electrode, the fourth storage electrode and the passivation layer between the third storage electrode and the fourth storage electrode form a third storage capacitor, and wherein the first to third storage capacitors are connected in parallel.

15. The substrate according to claim 11, further comprising a power line spaced apart from and parallel with the data line, wherein the gate line is formed in the same layer as the gate electrode, and wherein the data line is formed in the same layer as the source and drain electrodes.

16. The substrate according to claim 11, wherein each side of the semiconductor layer includes an ohmic contact layer of polysilicon that is doped with impurities, and an active layer of intrinsic polysilicon below the gate electrode.

17. The substrate according to claim 11, further comprising a buffer layer on the substrate and below the semiconductor layer and the first storage electrode.

* * * * *

UNITED STATES PATENT AND TRADEMARK OFFICE
CERTIFICATE OF CORRECTION

PATENT NO.         : 8,614,462 B2
APPLICATION NO.    : 13/285584
DATED              : December 24, 2013
INVENTOR(S)        : Hee-Dong Choi et al.

Page 1 of 1

It is certified that error appears in the above-identified patent and that said Letters Patent is hereby corrected as shown below:

In the Claims

In column 8, claim 3, line 48, after "storage region, and" insert --forming--.

Signed and Sealed this
Twenty-ninth Day of April, 2014

Michelle K. Lee
*Deputy Director of the United States Patent and Trademark Office*